(12) United States Patent
Wang et al.

(10) Patent No.: US 10,185,141 B2
(45) Date of Patent: Jan. 22, 2019

(54) CASCADED ELECTRICAL DEVICE BUS STRUCTURE SYSTEMS AND METHODS

(71) Applicant: General Electric Company, Schenectady, NY (US)

(72) Inventors: Ruxi Wang, Cohoes, NY (US); Douglas Link, Madison, WI (US); Melissa Freeman, Madison, WI (US); Fengfeng Tao, Clifton Park, NY (US); Juan Antonio Sabate, Wilton, NY (US); Eladio Clemente Delgado, Burnt Hills, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/632,002

(22) Filed: Jun. 23, 2017

(65) Prior Publication Data
US 2018/0373020 A1     Dec. 27, 2018

(51) Int. Cl.
G02B 26/00      (2006.01)
H02G 5/00       (2006.01)
(Continued)

(52) U.S. Cl.
CPC .......... *G02B 26/001* (2013.01); *G01R 22/00* (2013.01); *G01R 33/04* (2013.01); *G01R 35/04* (2013.01); *H02G 5/007* (2013.01)

(58) Field of Classification Search
CPC ...... G02B 26/001; G01R 22/00; G01R 35/04; G01R 33/04; H02G 5/007
(Continued)

(56) References Cited

U.S. PATENT DOCUMENTS 5,365,424 A   11/1994  Deam et al.
5,579,217 A   11/1996  Deam et al.
(Continued)

FOREIGN PATENT DOCUMENTS

CN   201623650 U   11/2010
CN   203504422 U   3/2014

OTHER PUBLICATIONS

Cetin, Alper, et al.; "VSC-Based D-STATCOM With Selective Harmonic Elimination", IEEE Transactions on Industry Applications, vol. 45, Issue 3, pp. 1000-1015, May-Jun. 2009.
(Continued)

*Primary Examiner* — Sherman Ng
(74) *Attorney, Agent, or Firm* — GE Global Patent Operation; Pabitra Chakrabarti

(57) ABSTRACT

The present disclosure presents techniques to facilitate improving operation of an electrical system, which includes a bus structure that cascades multiple electrical devices. The bus structure includes a first outer conductive layer implemented as a positive layer; a second outer conductive layer implemented as a negative layer; a first intermediate conductive layer neighboring the first outer conductive layer; a second intermediate conductive layer neighboring the second outer conductive layer; and a third intermediate conductive layer neighboring the second intermediate conductive layer, in which the third intermediate conductive layer is implemented as an inter-device layer that facilitates electrically coupling at least two of the electrical devices in series. The first intermediate conductive layer is implemented as a negative layer and the second intermediate conductive layer is implemented as a positive layer to facilitate reducing stray inductance and/or increasing stray capacitance introduced in the electrical system during operation.

10 Claims, 6 Drawing Sheets

(51) Int. Cl.
*G01R 33/04* (2006.01)
*G01R 35/04* (2006.01)
*G01R 22/00* (2006.01)

(58) Field of Classification Search
USPC .......................................................... 174/68.2
See application file for complete search history.

(56) References Cited

U.S. PATENT DOCUMENTS

| 7,187,568 | B2 | 3/2007 | Radosevich et al. | |
|---|---|---|---|---|
| 8,785,784 | B1* | 7/2014 | Duford | H02K 3/26 |
| | | | | 174/255 |
| 2010/0232111 | A1* | 9/2010 | Baker | H05K 7/20927 |
| | | | | 361/699 |
| 2011/0215890 | A1 | 9/2011 | Abolhassani et al. | |
| 2014/0111959 | A1 | 4/2014 | Li et al. | |
| 2014/0209344 | A1* | 7/2014 | Kalayjian | H05K 7/1432 |
| | | | | 174/68.2 |
| 2016/0094153 | A1 | 3/2016 | Li et al. | |

OTHER PUBLICATIONS

Zhu, Yi-feng, et al.; "The Impact of DC-power Layout on Stray Inductance of Bridge Arm in Power Converters", The Open Electrical & Electronic Engineering Journal, vol. 9, pp. 1-6, 2015.

Wang, Jianing, et al.; "Effect of Key Physical Structures on the Laminated Bus Bar Inductance", IEEE 8th International Power Electronics and Motion Control Conference (IPEMC-ECCE Asia), May 22-26, 2016.

He, Feng-You, et al.; "Improvement on the Laminated Busbar of NPC Three-Level Inverters based on a Super symmetric Mirror Circulation 3D Cubical Thermal Model", Journal of Power Electronics, http://manuscript.jpe.or.kr/LTKPSWeb/uploadfiles/be/201609/300920161706133606250.pdf.

* cited by examiner

CASCADED ELECTRICAL DEVICE BUS STRUCTURE SYSTEMS AND METHODS

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, an electrical system may include multiple electrical devices electrically interconnected to facilitate supplying electrical power from an electrical power source (e.g., generator) to an electrical load. In some instances, the electrical devices may include a passive electrical device, such as a capacitor or an inductor, and/or an active electrical device that may be operationally controlled, such as an electromechanical switching device or a semiconductor switching device. For example, a power converter may include a capacitor and a semiconductor switching device, which may be controlled to convert alternating current (AC) electrical power received from an electrical source into direct current (DC) electrical power supplied to an electrical load.

In some instances, multiple electrical devices with lower power ratings may be electrically coupled in series, thereby cascading the electrical devices to facilitate implementation in higher power rating applications. For example, the power converter may be implemented with multiple cascaded capacitors, which have a total capacitance expected to be sufficient for operation in a high voltage application, connected in series between a positive DC bus and a negative DC bus via multiple wires (e.g., electrical connectors). Additionally or alternatively, the power converter may be implemented with multiple cascaded semiconductor switching devices, which have a combined rating expected to reliably switch between connecting and disconnecting electrical power in the high voltage application, connected in series between the positive DC bus and the negative DC bus via multiple wires.

However, in some instances, switching between connecting and disconnecting electrical power to an electrical connector may introduce stray impedance (e.g., capacitance and/or inductance), which affects operation of the electrical system and/or surrounding electrical devices. For example, when electrical power is alternatingly connected to and disconnected from an electrical connector, change in electrical current flowing through the electrical connector may generate a magnetic field that introduces stray inductance in nearby electrically conductive material, such as another electrical connector or an electrical device in the electrical system. In some instances, stray inductance may result in voltage overshoot occurring in the electrical system, which may affect lifespan and/or operational reliability of electrical devices in the electrical system.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electrical system includes a bus structure to cascade multiple electrical devices. The first bus structure includes a first outer conductive layer implemented as a first positive layer; a second outer conductive layer implemented as a first negative layer; a first intermediate conductive layer neighboring the first outer conductive layer and electrically coupled to the second outer conductive layer, in which the first intermediate conductive layer is implemented as a second negative layer to facilitate reducing stray inductance, increasing stray capacitance, or both introduced in the electrical system during operation; a second intermediate conductive layer neighboring the second outer conductive layer and electrically coupled to the first outer conductive layer, in which the second intermediate conductive layer is implemented as a second positive layer to facilitate reducing the stray inductance, increasing the stray capacitance, or both introduced in the electrical system during operation; and a third intermediate conductive layer neighboring the second intermediate conductive layer, in which the third intermediate conductive layer is implemented as an inter-device layer that facilitates electrically coupling at least two of the multiple electrical devices in series.

In another embodiment, a method for implementing a bus structure to be deployed in an electrical system includes forming multiple layers, in which the multiple layers include multiple conductive layers and multiple non-conductive layers each formed between a pair of neighboring conductive layers; implementing a first conductive layer of the multiple conductive layers formed on a first side of the bus structure as a first positive layer; implementing a second conductive layer of the multiple conductive layers formed on a second side of the bus structure opposite the first side as a first negative layer; implementing a third conductive layer of the multiple conductive layers separated from the second conductive layer by a first non-conductive layer of the multiple non-conductive layers as a second positive layer to facilitate reducing magnitude of a voltage overshoot produced in the electrical system when the bus structure is deployed in the electrical system; implementing a fourth conductive layer of the multiple conductive layers separated from the first conductive layer by a second non-conductive layer of the multiple non-conductive layers as a second negative layer to facilitate reducing magnitude of the voltage overshoot produced in the electrical system when the bus structure is deployed in the electrical system; and implementing a fifth conductive layer of the multiple conductive layers separated from the fourth conductive layer by a third non-conductive layer of the multiple non-conductive layers as a first inter-device layer to facilitate electrically coupling at least a first electrical device and a second electrical device in series.

In another embodiment, a tangible, non-transitory, computer-readable medium stores instructions executable by one or more processors of a design device to facilitate implementing a bus structure. The instructions include instructions to determine, using the one or more processors, characteristics of an electrical system that the bus structure is expected to be deployed in, in which the characteristics include number of electrical devices expected to be cascaded by the bus structure and expected current flow order through the electrical devices; determine, using the one or more processor, target design parameters to be used to implement the bus structure based at least in part on the characteristics of the electrical system, in which the target design parameters indicate at least number of conductive layers to be implemented in the bus structure and assignment of each of the conductive layers as one of a positive layer, a negative layer, and an inter-device layer; and indicate, using the one or more processors, the target design parameters to facilitate implementing the bus structure using manufacturing equipment.

BRIEF DESCRIPTION OF THE DRAWINGS

Various aspects of this disclosure may be better understood upon reading the following detailed description and upon reference to the drawings in which.

DETAILED DESCRIPTION

Figure 1:
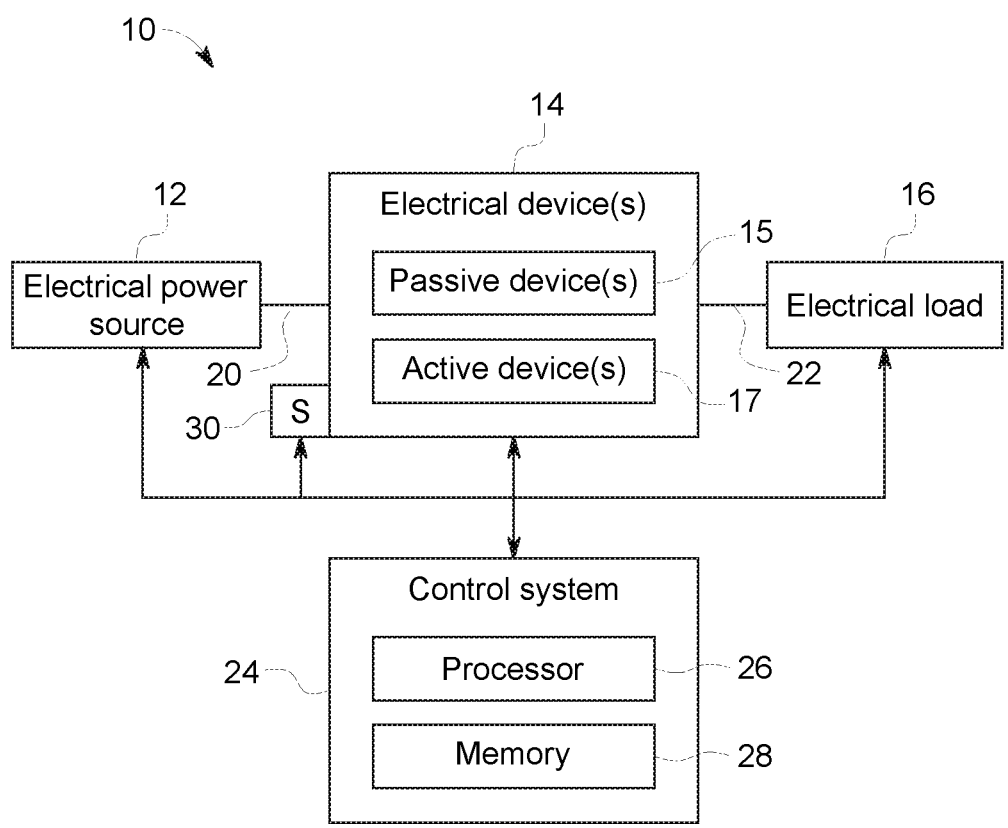
FIG. 1 is a block diagram of an electrical system including one or more electrical devices electrically coupled between an electrical power source and an electrical load, in accordance with an embodiment of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to electrical systems including multiple electrically interconnected electrical devices. In some instances, an electrical system may include a passive electrical device, such as a capacitor, an inductor, a resistor, and/or the like. Additionally or alternatively, the electrical system may include an active electrical devices that may be actively controlled, for example, to selectively connect and/or disconnect flow of electrical power though the electrical system. In other words, in some instances, the electrical devices in the electrical system may include one or more switching devices. For example, the electrical system may include an electromechanical switching device, such as a relay or a contactor, and/or a semiconductor switching device, such as a metal-oxide-semiconductor field-effect transistor (MOSFET) or a bipolar junction transistor (BJT).

In any case, the electrical devices in the electrical system may operate to facilitate supplying electrical power from an electrical power source (e.g., generator) to an electrical load. For example, a power converter may be electrically coupled between an alternating current (AC) power source and a direct current (DC) electrical load. In operation, electrical devices in the power converter (e.g., a composite device) may convert AC electrical power received from the AC power source into DC electrical power, which may then be supplied to the DC electrical load.

To facilitate converting AC electrical power into DC electrical power, the power converter may selectively supply electrical power from input AC buses to output DC buses. Thus, in some instances, the power converter may include a switching device, for example, electrically coupled between a positive DC bus and a negative DC bus. Additionally, the power converter may filter (e.g., smooth) generated DC electrical power using stored electrical power. Thus, in some instances, the power converter may include a capacitor, for example, electrically coupled between the positive DC bus and the negative DC bus.

Generally, each electrical device may be rated to operate using electrical power with specific characteristics (e.g., voltage, current, and/or frequency). For example, for low voltage applications, capacitance utilized in the power converter may be implemented using a single capacitor. Additionally or alternatively, for low voltage applications, control over supply of electrical power utilized in the power converter may be implemented using a single switching device.

To enable implementation in higher electrical power (e.g., medium voltage or high voltage) applications, an electrical system may be implemented using multiple cascaded electrical devices, which are each rated for lower electrical power (e.g., low voltage) applications. For example, instead of a single capacitor, the power converter may be implemented using three cascaded capacitors electrically coupled in series between the positive DC bus and the negative DC bus. Additionally or alternatively, instead of a single switching device, the power converter may be implemented using three cascaded switching devices electrically coupled in series between the positive DC bus and the negative DC bus. Since connected in series, operational constraints (e.g., voltage rating compared to voltage drop) may be divided between multiple electrical devices, thereby enabling lower electrical power rated electrical devices to be used for higher electrical power applications.

In any case, to facilitate implementing an electrical system, electrical devices may be electrically interconnected via electrical connectors, such as wires or cables. For example, to implement the cascaded capacitors in the power converter, a first wire may be electrically coupled between the positive DC bus and a first capacitor, a second wire may be electrically coupled between the first capacitor and a second capacitor, a third wire may be electrically coupled between the second capacitor and a third capacitor, and a fourth wire may be electrically coupled between the third capacitor and the negative DC bus. Additionally or alternatively, to implement the cascaded switching devices in the power converter, a fifth wire may be electrically coupled between the positive DC bus and a first switching device, a sixth wire may be electrically coupled between the first switching device and a second switching device, a seventh wire may be electrically coupled between the second switching device and a third switching device, and an eighth wire may be electrically coupled between the third switching device and the negative DC bus.

As described above, operation of active electrical devices may be actively controlled to control flow of electrical power in an electrical system. For example, in an open position, a switching device may block (e.g., disable) flow of electrical current through the switching device and, thus, an electrical connector electrically coupled to the switching device. On the other hand, in a closed position, the switching device may permit (e.g., enable) flow of electrical current through the switching device and, thus, the electrical connector electrically coupled to the switching device.

To facilitate supplying electrical power to the electrical load, in some instances, switching devices electrically coupled between the electrical power source and the electrical load may be selectively switched between the open position and the closed position. For example, in the power converter, the cascaded switching devices may be instructed to successively switch between the open position and the closed position. In this manner, the cascaded switching devices may be operated to alternatingly enable and disable flow of electrical power through one or more corresponding electrical connectors.

In some instances, flow of electrical power through an electrical system may produce stray impedance (e.g., capacitance or inductance) in surrounding electrically conductive material, such as an electrical connector or an electrical device in the electrical system. For example, when electrical current flows through an electrical connector, the electrical current may produce a magnetic field, which interacts with electrically conductive material is located in relatively close proximity. In particular, changes in electrical current flowing through the electrical connector may produce stray inductance in the electrically conductive material. Additionally, when voltage of an electrical connector is different from voltage of electrically conductive material located in relatively close proximity, the voltage difference may produce an electric field and, thus, stray capacitance between the electrical connector and the electrically conductive material.

However, in some instances, stray impedance produced in an electrical system may affect operation of electrical devices in the electrical system. For example, stray inductance and/or stray capacitance of an electrical connector may affect magnitude of voltage overshoot (e.g., spike) produced when a switching device switches from the open position to the closed position. In particular, since inductors generally resist sudden changes in current flow, an increase in stray inductance may result in an increase in magnitude of the voltage overshoot. Additionally, since capacitors generally resist sudden changes in voltage, an increase in stray capacitance may result in a decrease in magnitude of the voltage overshoot.

When propagated through the electrical system, the voltage overshoot may stress operation of one or more downstream electrical devices. As described above, electrical devices are generally rated for operation within specific electrical power characteristics. For example, a capacitor may be rated to reliably store electrical energy when it receives electrical power with voltage less than a voltage threshold. Additionally or alternatively, a switching device may be rated to reliably switch between connecting and disconnecting electrical power that has voltage less than a voltage threshold. In any case, stressing operation of an electrical device may reduce lifespan and/or operational reliability of the electrical device—particularly when the voltage overshoot exceeds voltage rating of the electrical device.

Accordingly, the present disclosure provides techniques to facilitate improving operation of an electrical system, for example, by reducing magnitude of voltage overshoots expected to be produced during operation of the electrical system. To facilitate reducing magnitude of voltage overshoot, in some embodiments, cascaded electrical devices may be electrically and physically coupled via a bus structure, such as a laminated bus bar or a printed circuit board (PCB). In other words, the bus structure may be an electrical connector that electrically couples multiple electrical devices in series. For example, in the power converter, a first bus structure may electrically couple each of the cascaded capacitors in series and a second bus structure may electrically couple each of the cascaded switching devices in series.

The bus structure may include multiple parallel conductive layers separated by non-conductive layers implemented to facilitate reducing stray inductance and/or increasing stay capacitance introduced in the electrical system. In some embodiments, the bus structure may be implemented based at least in part on design parameters, such as number of layers and/or conductive layer assignments. Additionally, in some embodiments, the design parameters may be determined based at least in part on expected characteristics of the electrical system, such as number of cascaded electrical devices expected to be coupled to the bus structure, expected current flow order through the cascaded electrical devices, and/or expected operational (e.g., current and/or voltage) rating of the electrical system.

For example, when a first bus structure is expected to cascade N electrical devices for implementation in a lower operational rating electrical system, a design device may determine its design parameters to indicate that the first bus structure should include N+3 conductive layers. In other words, the first bus structure may include two outer conductive layers and N+1 intermediate conductive layers. On the other hand, when a second (e.g., stacked) bus structure is expected to cascade N electrical devices for implementation in a higher operational rating electrical system, the design device may determine its design parameters to indicate that the second bus structure should include 2N+4 conductive layers. In other words, the second bus structure may include two outer conductive layers and 2N+2 intermediate conductive layers (e.g., first group of N intermediate conductive layers separated from a second group of N intermediate conductive layers by two central intermediate conductive layers).

In any case, since a bus structure includes multiple layers, to facilitate cascading electrical devices, through-holes may be formed across multiple layers of the bus structure and perpendicular vias (e.g., electrical connections) may be formed in the through-holes to facilitate electrically coupling each conductive layer to a corresponding electrical device. Additionally, the bus structure may include a positive layer, which may be electrically coupled to a positive DC bus, and a negative layer, which may be electrically coupled to a negative DC bus. In some embodiments, the outer conductive layers of the bus structure may each be implemented as either a positive layer or a negative layer. For example, the design device may determine the design parameters of the first bus to indicate that a first outer conductive layer should be implemented as a positive layer and that a second outer conductive layer should be implemented as a negative layer.

Additionally, in some embodiments, intermediate conductive layers of the bus structure closest to each outer conductive layer may also be implemented as either a positive layer or a negative layer. For example, the design device may determine the design parameters of the first bus bar to indicate that a first intermediate conductive layer neighboring (e.g., closest to) the first outer conductive layer (which is to be implemented as a positive layer) should be implemented as a negative layer and that a second intermediate conductive layer closest to the second outer conductive layer (which is to be implemented as a negative layer) should be implemented as a positive layer. Furthermore, in some embodiments, central intermediate conductive layers of the bus structure may each be implemented as either a positive layer or a negative layer. Since magnetic fields produced by current flow in opposite directions cancel and magnitude of magnetic field is inversely related to distance, implementing a bus structure with positive layers and negative layers in close proximity may facilitate reducing stray inductance introduced in the electrical system. Additionally, since magnitude of electric field is proportional to voltage difference and inversely related to distance, implementing a bus structure with positive layers and negative layers in close proximity may facilitate increasing stray capacitance across the cascaded electrical devices.

Each remaining intermediate conductive layer of the bus structure may be implemented as an inter-device layer. In some embodiments, the remaining intermediate conductive layers may be implemented as inter-device layers based at least in part on expected current flow order through the cascaded electrical devices and/or relative position of the conductive layers. For example, when electrical current is expected to flow from a first electrical device to a second electrical device, the design device may determine the design parameters of the first bus bar to indicate that a third intermediate conductive layer neighboring (e.g., closest to) the second intermediate conductive layer should be implemented as a first inter-device layer that facilitates forming an electrical connection between the first electrical device to the second electrical device. Additionally, when electrical current is expected to flow from the second electrical device to a third electrical device, the design device may determine the design parameters of the first bus bar to indicate that a fourth intermediate conductive layer neighboring (e.g., closest to) the third intermediate conductive layer should be implemented as a second inter-device layer that facilitates forming an electrical connection between the second electrical device and the third electrical device.

A bus structure with inter-device layers implemented based at least in part on current flow order through cascaded electrical devices may facilitate balancing stray capacitance between each of the cascaded electrical devices. In this manner, the bus structure may facilitate improving lifespan uniformity and/or operational reliability uniformity of the cascaded electrical devices. With this understanding, the present disclosure provides techniques for implementing a bus structure, which when deployed in an electrical system to cascade multiple electrical devices may facilitate improving operation of the electrical system, for example, by reducing magnitude of voltage overshoot, reducing operational stress, balancing stray capacitance between cascaded electrical devices, increasing stray capacitance across the cascaded electrical devices, and/or reducing stray inductance across the cascaded electrical devices.

To help illustrate, an example embodiment of an electrical system 10 is shown in FIG. 1. In some embodiments, the electrical system 10 may be included in an industrial system, a manufacturing system, an automation system, or the like, such as a factory or plant. Additionally, in some embodiments, the electrical system 10 may be included in a computing system, an automotive system, or an imaging system, such as a magnetic resonance imaging (MRI) system.

In any case, in the depicted embodiment, the electrical system 10 includes an electrical power source 12, an electrical load 16, and one or more electrical devices 14. As depicted, the electrical power source 12 is electrically coupled to the electrical devices 14 via a first electrical connection 20 and the electrical devices 14 are electrically coupled to the electrical load 16 via a second electrical connection 22. In some embodiments, the first electrical connection 20 and/or the second electrical connection 22 may each include one or more electrical connectors, such as wires, cables, bus structures (e.g., laminated bus bars or PCB), and/or the like.

Utilizing the first electrical connection 20, the electrical power source 12 may supply electrical power to the electrical devices 14. In operation, the electrical power source 12 may output electrical power with specific characteristics, such as type (e.g., AC or DC), voltage, current, frequency, and/or the like. For example, in some embodiments, the electrical power source 12 may be an alternating current (AC) power source, such as an AC power generator, an alternator, and/or the like. In other words, in such embodiments, the electrical power source 12 may output AC electrical power to one or more of the electrical devices 14. In other embodiments, the electrical power source 12 may a direct current (DC) power source, such as a battery, a capacitor, an ultra-capacitor, a DC power supply, and/or the like. In other words, in such embodiments, the electrical power source 12 may output DC electrical power to one or more of the electrical devices 14.

In any case, utilizing the second electrical connection 22, one or more of the electrical devices 14 may supply electrical power to the electrical load 16. In some embodiments, the electrical load 16 may operate to store received electrical power as electrical energy and/or to perform an operation, such as actuating a motor, using the received electrical power. Additionally, the electrical load 16 may expect (e.g., be designed) to operate using electrical power with target characteristics such as, target type (e.g., AC or DC), target voltage, target current, target frequency, and/or the like. For example, in some embodiments, the electrical load 16 may be a DC load, such as a battery, a computer, an engine control unit, a display, a light bulb, and/or the like. In other words, in such embodiments, electrical load 16 may expect to receive DC electrical power from one or more of the electrical devices 14. In other embodiments, the electrical load 16 may be an AC load, such as an electric motor, a heating, ventilating, and air conditioning (HVAC) system, and/or the like. In other words, in such embodiments, the electrical load 16 may expect to receive AC electrical power from one or more of the electrical devices 14.

In some embodiments, characteristics of electrical power output by the electrical power source 12 may differ from the target characteristics the electrical load 16 expects to receive, for example, when the electrical power source 12 is an AC power source and the electrical load 16 is a DC load. To facilitate supplying electrical power with the target characteristics, the electrical devices 14 may operate on electrical power received from the electrical power source 12. In some embodiments, the electrical devices 14 may include one or more passive electrical devices 15, which passively operate on electrical power flowing through the electrical system 10. For example, a passive electrical device 15 may be an impedance device, such as a resistor, a capacitor, an inductor, a diode, or the like.

Additionally, in some embodiments, the electrical devices 14 may include one or more active electrical devices 17, which may actively be controlled to adjust operation on electrical power flowing through the electrical system 10. For example, an active electrical device 17 may be a switching device, such as an electromechanical switching device (e.g., relay or contactor), a semiconductor switching device (e.g., MOSFET or BJT), or the like. In some embodiments, an active electrical device 17 (e.g., switching device) may alternating switch between an open position and a closed position. To facilitate achieving higher switch frequencies, in some embodiments, an active electrical device 17 may be silicon-carbide (SiC) MOSFET.

In any case, in some embodiments, the electrical system 10 may include a control system 24 to control and/or monitor operation of the electrical devices 14, the electrical power source 12, and/or the electrical load 16. To facilitate controlling and/or monitoring operation, the control system 24 may include a processor 26 and memory 28. In some embodiments, the memory 28 may store instructions executable by the processor 26 and/or data to be processed (e.g., analyzed) by the processor 26. Thus, the memory 28 may include one or more tangible, non-transitory, computer readable media, such as random access memory (RAM), read only memory (ROM), rewritable non-volatile memory (e.g., flash memory), a hard drive, an optical discs, and/or the like. Additionally, the processor 26 may include one or more general-purpose microprocessors, one or more application specific processors (ASICs), one or more field programmable logic arrays (FPGAs), or any combination thereof. Additionally or alternatively, the control system 24 may utilize analog control based on op-amps, logic gates, and/or other control circuitry.

In some embodiments, the control system 24 may monitor operation of the electrical system 10 by determining operational parameters of the electrical system 10. To facilitate determining the operational parameters, one or more sensors 30 may be disposed on or coupled to the electrical devices 14, the first electrical connection 20, and/or the second electrical connection 22. For example, the sensors 30 may include temperature sensors, pressure sensors, voltage sensors, current sensors, and/or power sensors.

In any case, a sensor 30 may operate to measure an operational parameter of the electrical system 10 and generate sensor data indicative of the measured operational parameter. Thus, the control system 24 may be communicatively coupled to the sensors 30 disposed in the electrical system 10. In this manner, the control system 24 may monitor operation of the electrical system 10 by determining the measured operational parameters based at least in part on sensor data received from one or more sensors 30.

In addition to merely monitoring operation, in some embodiments, the control system 24 may control operation of the electrical system 10 based at least in part on the determined operational parameters. In some embodiments, the control system 24 may control operation of one or more electrical devices 14 (e.g., an active electrical device 17), the electrical power source 12, and/or the electrical load 16. Thus, the control system 24 may be communicatively coupled to the electrical devices 14, the electrical power source 12, and/or the electrical load 16.

In this manner, the control system 24 may control operation of a component (e.g., electrical device 14, electrical power source 12, or electrical load 16) by communicating a control signal instructing the component to adjust operation. For example, the control system 24 may communicate a control signal to an active electrical device 17 (e.g., switching device), which instructs the active electrical device 17 to switch from an open position to a closed position. Additionally or alternatively, the control system 24 may communicate a control signal to the active electrical device 17, which instructs the active electrical device 17 to switch from the closed position to the open position.

As described above, the electrical devices 14 may operate to facilitate converting electrical power received from the electrical power source 12 into electrical power with the target characteristics expected to be received by the electrical load 16. To facilitate producing the target characteristics, in some embodiments, multiple electrical devices 14 may operate together. Thus, in such embodiments, the control system 24 may coordinate operation of multiple electrical devices 14, for example, by directly controlling operation of an active electrical device 17 and/or indirectly controlling operation of a passive electrical device 15 via the active electrical device 17. Additionally, in some embodiments, multiple electrical devices 14 that operate together (e.g., as a unit) may be grouped into one or more composite devices, such as a power converter, a power conditioning unit, or the like.

Figure 2:
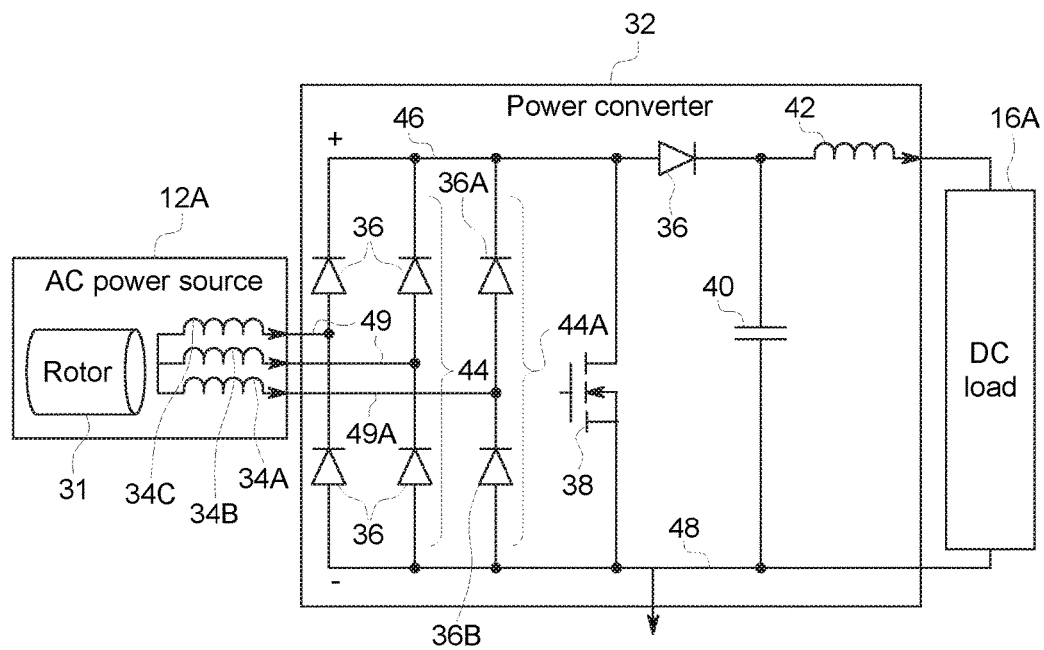
FIG. 2 is a circuit diagram of electrical devices implemented in a power converter electrically coupled between an alternating current (AC) power source and a direct current (DC) load, in accordance with an embodiment of the present disclosure.

To help illustrate, an example embodiment of a power converter 32 (e.g., composite device) is shown in FIG. 2. Generally, the power converter 32 may operate to convert AC electrical power into DC electrical power. Thus, the power converter 32 may be electrically coupled between an AC power source 12A and a DC load 16A. It should be appreciated that the depicted power converter 32 is merely intended to be illustrative and not limiting. In particular, it is recognized that other power converters 32 may be implemented differently compared to the depicted embodiment. For example, other power converters 32 may include different number of electrical devices 14, different types of electrical devices, and/or different inter-device electrical connections.

In any case, as described above, the AC power source 12A may operate to generate AC electrical power. To facilitate generating AC electrical power, the AC power source 12A may include a rotor 31 and a stator, which includes a first winding 34A, a second winding 34B, and a third winding 34C. In other embodiments, the windings 34 may instead be located on the rotor 31.

In any case, with regard to the depicted embodiment, the rotor 31 may generate a rotor magnetic field, for example, using a permanent magnet or an electromagnet. In some embodiments, the rotor 31 may be mechanically coupled to a mechanical energy source, such as an internal combustion engine, a gas turbine, a steam turbine, a wind turbine, or the like. In such embodiments, the mechanical energy source may operate to actuate (e.g., rotate) the rotor 31 and, thus, the rotor magnetic field, thereby inducing voltage in the windings 34.

In some embodiments, the voltage induced in each winding 34 may be used to generate a different phase of the AC electrical power. For example, the rotor 31 may induce a first voltage in the first winding 34A to generate a first phase of the AC electrical power, a second voltage in the second winding 34B to generate a second phase of the AC electrical power, and a third voltage in the third winding 34C to generate a third phase of the AC electrical power. Thus, in the depicted embodiment, the AC power source 12A may generate three phase AC electrical power. In other embodiments, the AC power source 12A may use any number of windings 34 to generate any number of phases.

In some embodiments, voltage and/or frequency of AC electrical power may be dependent at least in part on actuation speed of the rotor 31. For example, when actuation speed of the rotor 31 increases, the rate of change of the rotor magnetic flux may increase, thereby increasing magnitude of voltage and/or frequency of the AC electrical power generated. On the other hand, when actuation speed of the rotor 31 decreases, the rate of change of the rotor magnetic flux may decrease, thereby decreasing magnitude of voltage and/or frequency of the AC electrical power generated. In other words, when the actuation speed of the rotor 31 varies, the voltage and/or frequency of AC electrical power output from the AC power source 12A may also vary.

In any case, the power converter 32 may receive AC electrical power generated by the AC power source 12A and operate to convert the AC electrical power into voltage regulated DC electrical power supplied to the DC load 16A. Thus, with regard to the depicted embodiment, the power converter 32 may operate to convert the three-phase AC electrical power generated by the AC power source 12A into voltage regulated DC electrical power.

As described above, to facilitate converting AC electrical power into DC electrical power, the power converter 32 may be a composite device, which includes multiple electrical devices 14. In the depicted embodiment, the electrical devices 14 include diodes 36, a semiconductor switching device 38, a capacitor 40, and an inductor 42. In the depicted embodiment, a pair of diodes 36 is implemented on each phase leg 44, which is electrically coupled between a positive DC bus 46, a negative DC bus 48, and a corresponding AC bus 49. For example, on a first phase leg 44A, a first diode 36A is electrically coupled between the positive DC bus 46 and a first AC bus 49A, which is electrically coupled to the first winding 34A and, thus, supplies a first phase of AC electrical power to the first phase leg 44B. Additionally, on the first phase leg 44A, a first diode 36A is electrically coupled between the positive DC bus 46 and the first AC bus 49.

In the depicted embodiment, the semiconductor switching device 38 is electrically between the positive DC bus 46 and the negative DC bus 48. In some embodiments, the semiconductor switching device 38 may include a wide band-gap transistor, such as a silicon carbide (SiC) transistor, a metal-oxide-semiconductor field-effect transistor (MOSFET), a field-effect transistor (FET), a bipolar junction transistor (BJT), an insulated-gate bipolar transistor (IGBT), or the like. In any case, in an open position, the semiconductor switching device 38 may block (e.g., disable) current flow through the semiconductor switching device 38. Additionally, in a closed position, the semiconductor switching device 38 may permit (e.g., enable) current flow current flow through the semiconductor switching device 38. In some embodiments, the semiconductor switching device 38 may alternatingly switch between the open position and the closed position to control flow of electrical power between the positive DC bus 46 and the negative DC bus 48, for example, based at least in part on frequency of the AC electrical power generated by the AC power source 12A.

Since the DC load 16A expects to receive electrical power, in the depicted embodiment, a diode 36 is electrically coupled on the positive DC bus 46. In this manner, the diode 36 may reduce likelihood of the power converter 32 and/or the AC power source 12A attempting to draw electrical power from the DC load 16A. Additionally, the capacitor 40 and/or the inductor 42 may act as a filter to smooth DC electrical power before supply to the DC load 16A.

As indicated above, other power converters 32 may be implemented in a different manner than the depicted embodiment. For example, in some embodiments, one or more of the diodes 36 of each phase leg 44 may be replaced with a semiconductor switching device 38. Additionally, in some embodiments, one or more electrical devices 14 may each be replaced with cascaded electrical devices 14, which includes multiple electrical devices 14 connected in series, to facilitate adaptation for deployment in other applications. For example, in the depicted embodiment, the semiconductor switching device 38 and/or the capacitor 40 may be rated (e.g., sized) for reliable operation in lower voltage applications. To facilitate deployment in higher voltage applications, instead of a single semiconductor switching device 38, the power converter 32 may be implemented using multiple cascaded semiconductor switching devices 38. Additionally or alternatively, instead of a single capacitor 40, the power converter 32 may be implemented using multiple cascaded capacitors 40.

Figure 3:
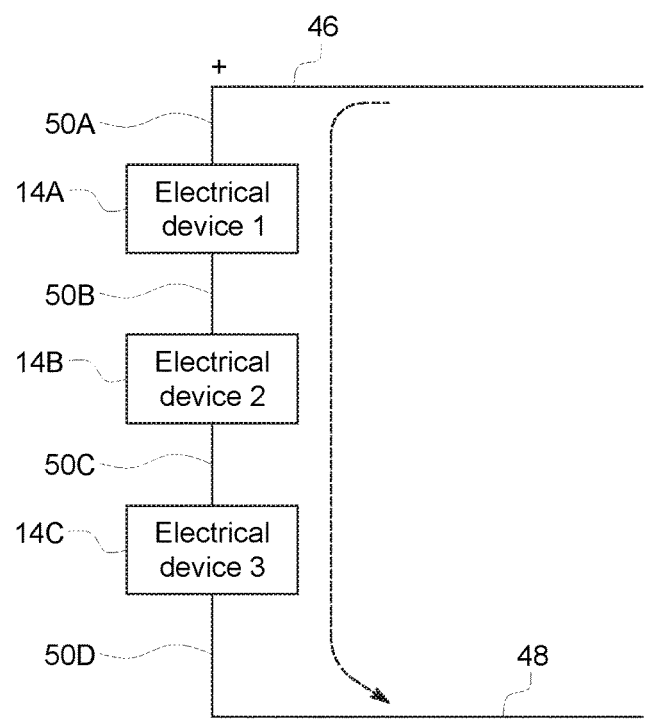
FIG. 3 is a circuit diagram of cascaded electrical devices, in accordance with an embodiment of the present disclosure.

To help illustrate, an example of cascaded electrical devices 14 is shown in FIG. 3. In the depicted embodiment, three electrical devices 14—namely a first electrical device 14A, a second electrical device 14B, and a third electrical device 14C—are cascaded. It should be appreciated that the depicted embodiment is merely intended to be illustrative and not limiting. In particular, it is recognized that other implementations of cascaded electrical devices 14 may include a different number (e.g., two, four, five, or more) of electrical devices 14.

In any case, as depicted, the cascaded electrical devices 14 are electrically coupled between the positive DC bus 46 and the negative DC bus 48 via one or more electrical connections 50. For example, a first electrical connection 50A may be formed between the positive DC bus 46 and the first electrical device 14A, a second electrical connection 50B may be formed between the first electrical device 14A and the second electrical device 14B, a third electrical connection 50C may be formed between the second electrical device 14B and the third electrical device 14C, and a fourth electrical connection 50D may be formed between the third electrical device 14C and the negative DC bus 48.

In some embodiments, the electrical connections 50 may be implemented via one or more electrical connectors, such as wires, cables, bus structures (e.g., bus bar or PCB), and/or the like. For example, the first electrical connection 50A may be implemented using a first wire, the second electrical connection 50B may be implemented using a second wire, the third electrical connection 50C may be implemented using a third wire, and the fourth electrical connection 50D may be implemented using a fourth wire.

As described above, during operation of the electrical system 10, stray impedance (e.g., capacitance or inductance)

may be introduced in surrounding electrically conductive material, such as electrical devices 14 and/or electrical connectors in the electrical system 10. Since strength of magnetic fields and electric fields generally vary with distance, resulting stray impedance introduced in the electrical system 10 may be dependent on implementation of the electrical connections 50. In other words, implementing the electrical connections 50 with different electrical connector configurations may result in different magnitudes of stray impedance being introduced in electrical system 10.

Figure 4:
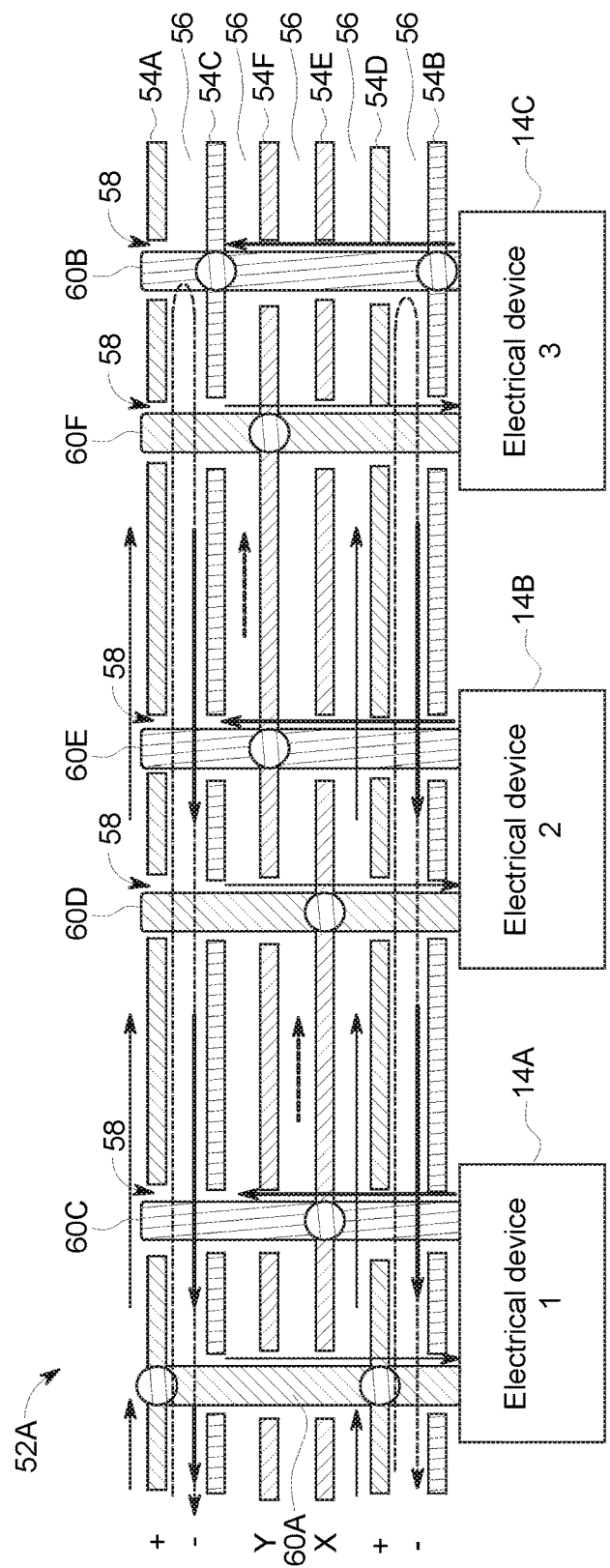
FIG. 4 is a schematic diagram of a bus structure implemented to electrically and physically couple cascaded electrical devices, in accordance with an embodiment of the present disclosure.

To help illustrate, an example of a bus structure 52 (e.g., second bus structure 52B) implemented to cascade three electrical devices 14 is shown in FIG. 4. It should be appreciated that the depicted bus structure 52 is merely intended to be illustrative and not limiting. In particular, it is recognized that implementing a bus structure 52 using the techniques of the present disclosure may allow for some variations, for example, with different number of layers and/or with the layer assignments reversed. Moreover, as will be described in more detail below, the techniques of the present disclosure may also enable implementing a bus structure 52 used to cascade two electrical devices 14, four electrical devices 14, five electrical devices 14, or more electrical devices 14.

In any case, the second bus structure 52B may include conductive layers 54 and non-conductive layers 56, which electrically and physically separate the conductive layers 54. Thus, each non-conductive layer 56 may be formed from an electrically insulating material, such as silicon, rubber, plastic, and/or the like. Additionally, each conductive layer 54 may be formed from an electrically conductive material, such as copper. Furthermore, in some embodiments, each conductive layer 54 and each non-conductive layer 56 may have approximately the same surface area (e.g., width and length). Thus, in some embodiments, the second bus structure 52B may be implemented as a multi-layer bus bar or a multi-layer PCB.

As will be described in more detail below, design parameters of a bus structure 52, including number of conducting layer 54, may be determined based at least in part on number of electrical devices 14 expected to be cascaded by the bus structure 52. For example, to cascade N electrical devices 14, the bus structure 52 may be implemented using N+3 conductive layers 54. Since three electrical devices 14 are cascaded, in the depicted embodiment, the second bus structure 52B includes six conductive layers 54 and, thus, at least five non-conductive layers 56.

In some embodiments, each conductive layer 54 may be implemented as one of a positive layer, a negative layer, or an inter-device layer. In particular, when electrical devices 14 are coupled to the bus structure 52, an inter-device layer may provide an electrical connection 50 between two of the electrical devices 14. Additionally, when the bus structure 52 is deployed, a positive layer may provide an electrical connection 50 between the positive DC bus 46 and an electrical device 14 coupled to the bus structure 52. Furthermore, when the bus structure 52 is deployed, a negative layer may provide an electrical connection 50 between the negative DC bus 48 and another electrical device 14 coupled to the bus structure 52. Thus, to cascade multiple electrical devices 14, each conductive layer 54 may be electrically coupled to one of the electrical devices 14.

Since the bus structure 52 includes multiple layers, to facilitate electrically coupling conductive layers 54 to the electrical devices 14, through-holes 58 may be formed in the bus structure 52. For example, the through-holes 58 may be formed perpendicular to a surface (e.g., width×length) of the bus structure 52. Additionally, perpendicular vias 60 may be formed in each through-hole 58. In particular, each perpendicular via 60 may be electrically coupled to one or more conductive layers 54 and electrically insulated from the remaining conductive layers 54.

In the depicted embodiment, a first outer conductive layer 54A is implemented as a positive layer and a second outer conductive layer 54B is implemented as a negative layer. To facilitate reducing stray inductance, an intermediate conductive layer 54 (e.g., between the first outer conductive layer 54A and the second outer conductive layer 54B) neighboring (e.g., closest to) each outer conductive layer 54 may also be implemented as either a positive layer or a negative layer. For example, since the first outer conductive layer 54A is implemented as a positive layer, a first intermediate conductive layer 54C may be implemented as a negative layer. Additionally, since the second outer conductive layer 56B is implemented as a negative layer, a second intermediate conductive layer 54D may be implemented as a positive layer.

Thus, when the first electrical device 14A is coupled to the second bus structure 52B, the first outer conductive layer 54A and the second intermediate conductive layer 54D may be electrically coupled to the first electrical device 14A via a first perpendicular via 60A. In other words, the first outer conductive layer 54A, the second intermediate conductive layer 54D, and the first perpendicular via 60A may be implemented to form the first electrical connection 50A between the positive DC bus 46 and the first electrical device 14A. Additionally, when the third electrical device 14C is coupled to the second bus structure 52B, the second outer conductive layer 54B and the first intermediate conductive layer 54C may be electrically coupled to the third electrical device 14C via a second perpendicular via 60B. In other words, the second outer conductive layer 54B, the first intermediate conductive layer 54C, and the second perpendicular via 60B may be implemented to form the fourth electrical connection 50D between the third electrical device 14C and the negative DC bus 48.

Each remaining intermediate conductive layer 54 may be implemented as an inter-device layer. In some embodiments, the remaining intermediate conductive layers 54 may be implemented as inter-device layers based at least in part on expected current flow order through the cascaded electrical devices 14 and/or relative position of the conductive layers 54. For example, since electrical current is expected to flow from the first electrical device 14A to the second electrical device 14B, a third intermediate conductive layer 54E may be implemented as a first inter-device layer, which facilitates electrically coupling the first electrical device 14A and the second electrical device 14B. Thus, when the first electrical device 14A is coupled to the second bus structure 52B, the third intermediate conductive layer 54E may be electrically coupled to the first electrical device 14A via a third perpendicular via 60C. Additionally, when the second electrical device 14B is coupled to the second bus structure 52B, the third intermediate conductive layer 54E may be electrically coupled to the second electrical device 14B via a fourth perpendicular via 60D. In other words, the third perpendicular via 60C, the third intermediate conductive layer 54E, and the fourth perpendicular via 60D may be implemented to form the second electrical connection 50B between the first electrical device 14A and the second electrical device 14B.

Additionally, since electrical current is expected to flow from the second electrical device 14B to the third electrical device 14C, a fourth intermediate conductive layer 54F may be implemented as a second inter-device layer, which facilitates electrically coupling the second electrical device 14B and the third electrical device 14C. Thus, when the second electrical device 14B is coupled to the second bus structure 52B, the fourth intermediate conductive layer 54F may be electrically coupled to the second electrical device 14B via a fifth perpendicular via 60E. Additionally, when the third electrical device 14C is coupled to the second bus structure 52B, the fourth intermediate conductive layer 54F may be electrically coupled to the third electrical device 14C via a sixth perpendicular via 60F. In other words, the fifth perpendicular via 60E, the fourth intermediate conductive layer 54F, and the sixth perpendicular via 60F may be implemented to form the third electrical connection 50C between the second electrical device 14B and the third electrical device 14C. In this manner, the second bus structure 52B may be implemented to cascade the first electrical device 14A, the second electrical device 14B, and the third electrical device 14C.

As described above, design parameters of bus structures 52 may vary based at least in part on target operational (e.g., current and/or voltage) rating of an electrical system 10. For example, current flow through electrically conductive material may be limited by physical dimension (e.g., size and/or surface area) of the conductive material. Thus, in some embodiments, current flow capabilities provided by a bus structure 52 may be increased by increasing size (e.g., thickness) of the conductive layers 54. Additionally or alternatively, current flow capabilities provided by a bus structure 52 may be increased by increasing number of conductive layers 54.

For example, a higher current capability bus structure 52 may be implemented by stacking multiple instances of the second bus structure 52B. When implemented merely by stacking two instances of the first bus structures 52, a resulting (e.g., stacked) bus structure may include twelve conductive layers with two directly adjacent positive and negative layer pairs. To facilitate reducing implementation associated cost, in some embodiments, multiple directly adjacent positive and negative layer pairs may instead be implemented using a single positive and negative layer pair.

To help illustrate, another example embodiment of a bus structure 52 (e.g., second bus structure 52B), which may provide higher current carrying capabilities compared to the bus structure (e.g., first bus structure 52) described above, is shown in FIG. 5. As depicted, the second bus structure 52B is generally implemented by stacking two instances of the first bus structures 52A using a single pair of central conductive layers 54—namely a first central conductive layer 54G implemented as a negative layer and a second central conductive layer 54H implemented as a positive layer.

Thus, when the first electrical device 14A is coupled to the second bus structure 52B, the first outer conductive layer 54A, the second intermediate conductive layer 54D, and the second central conductive layer 54H may be electrically coupled to the first electrical device 14A via the first perpendicular via 60A. In other words, the first outer conductive layer 54A, the second intermediate conductive layer 54D, the second central conductive layer 54H, and the first perpendicular via 60A may be implemented to form the first electrical connection 50A between the positive DC bus 46 and the first electrical device 14A. Additionally, when the third electrical device 14C is coupled to the second bus structure 52B, the second outer conductive layer 54B, the first central conductive layer 54G, and the first intermediate conductive layer 54C may be electrically coupled to the third electrical device 14C via the second perpendicular via 60B. In other words, the second outer conductive layer 54B, the first intermediate conductive layer 54C, the first central conductive layer 54G, and the second perpendicular via 60B may be implemented to form the fourth electrical connection 50D between the third electrical device 14C and the negative DC bus 48.

As described above, each remaining intermediate conductive layer 54 may be implemented as an inter-device layer. In some embodiments, the remaining intermediate conductive layers 54 may be implemented as inter-device layers based at least in part on expected current flow order through the cascaded electrical devices 14 and/or relative position of the conductive layers 54. For example, since electrical current is expected to flow from the first electrical device 14A to the second electrical device 14B, two instances of the third intermediate conductive layer 54E may be implemented as a first pair of inter-device layers, which facilitates electrically coupling the first electrical device 14A and the second electrical device 14B. Thus, when the first electrical device 14A is coupled to the second bus structure 52B, the two instances of the third intermediate conductive layer 54E may be electrically coupled to the first electrical device 14A via the third perpendicular via 60C. Additionally, when the second electrical device 14B is coupled to the second bus structure 52B, the two instances of third intermediate conductive layer 54E may be electrically coupled to the second electrical device 14B via the fourth perpendicular via 60D. In other words, the third perpendicular via 60C, the two instances of the third intermediate conductive layer 54E, and the fourth perpendicular via 60D may be implemented to form the second electrical connection 50B between the first electrical device 14A and the second electrical device 14B.

Additionally, since electrical current is expected to flow from the second electrical device 14B to the third electrical device 14C, two instances of the fourth intermediate conductive layer 54F may be implemented as a second pair of inter-device layers, which facilitates electrically coupling the second electrical device 14B and the third electrical device 14C. Thus, when the second electrical device 14B is coupled to the second bus structure 52B, the two instances of the fourth intermediate conductive layer 54F may be electrically coupled to the second electrical device 14B via the fifth perpendicular via 60E. Additionally, when the third electrical device 14C is coupled to the second bus structure 52B, the two instances of the fourth intermediate conductive layer 54F may be electrically coupled to the third electrical device 14C via the sixth perpendicular via 60F. In other words, the fifth perpendicular via 60E, the two instances of the fourth intermediate conductive layer 54F, and the sixth perpendicular via 60F may be implemented to form the third electrical connection 50C between the second electrical device 14B and the third electrical device 14C. In this manner, the second bus structure 52B may be implemented to cascade the first electrical device 14A, the second electrical device 14B, and the third electrical device 14C, for example, with increased current capabilities compared to the first bus structure 52A described with reference to FIG. 4 since the second bus structure 52B described with reference to FIG. 5 includes more conductive layers 54.

In a similar manner, bus structures 52 to provide further improved operational rating by stacking M instances of the first structure 52A. In other words, when implemented to electrically couple N electrical devices 14 by stacking M bus structures 52, a higher current bus structure may be implemented using $(N+3)+(M-1)(N+3-2)$ conductive layers 52 of which $(M-1)$ pairs of central conductive layers as a positive and negative layer pair. In any case, as described above, implementing the bus structure 52 in this manner described by the present disclosure may facilitate improving operation of the electrical system 10.

In particular, each conductive layer 54 implemented as a positive layer may be paired with a neighboring conductive layer 54 implemented as a negative layer. As such, electrical current flowing in the pair of neighboring conductive layers 54 may have approximately the same magnitude, but flow opposite directions. Since orientation of a magnetic field is dependent on current flow direction and magnitude of the magnetic field is dependent on current flow magnitude and distance, implementing the bus structure 52 with a negative layer in close proximity to each positive layer may result in magnetic fields produced by current flow in the positive layers and the negative layers canceling before reaching other conductive layers 54, thereby reducing stray inductance introduced in the electrical system 10 during operation.

Additionally, since electrically coupled between the positive DC bus 46 and the negative DC bus 48, a voltage drop may occur across each of the cascaded electrical devices 14. As such, different conductive layers 54 may have different voltages with the largest voltage difference occurring between positive layers and negative layers. Since magnitude of electric field is dependent on magnitude of voltage difference and distance, implementing the bus structure 52 with a negative layer in close proximity to each positive layer may increase magnitude of electric fields produced by voltage differences between conductive layers 54 in the bus structure, thereby increasing stray capacitance 61 introduced in the electrical system 10 during operation.

As described above, voltage stress (e.g., overshoot or spikes) produced when electrical power is initially connected or re-connected may affect operation of electrical devices 14 in the electrical system 10, for example, by reducing lifespan and/or operational reliability of one or more electrical devices 14. In fact, in some instances, magnitude of an operational effect and/or likelihood of producing the operational effect may increase as magnitude of the voltage overshoot increases. As described above, magnitude of the voltage overshoot may be dependent on stray impedance and/or stray capacitance introduced in the electrical system 10.

In particular, since inductors generally resist sudden changes in current flow, stray inductance introduced in the electrical system may result in electrical power unexpectedly flowing in the electrical system 10 and contributing to the voltage overshoot. Thus, implementing the bus structure 52 in the manner described herein to reduce stray inductance may facilitate reducing magnitude of voltage overshoots produced in the electrical system 10. Additionally, since capacitors generally resist sudden changes in voltage, stray capacitance may impede (e.g., block) electrical power that would otherwise contribute to the voltage overshoot. Thus, implementing the bus structure 52 in the manner described herein to increase stray capacitance may facilitate reducing magnitude of voltage overshoots produced in the electrical system 10.

Figure 6:
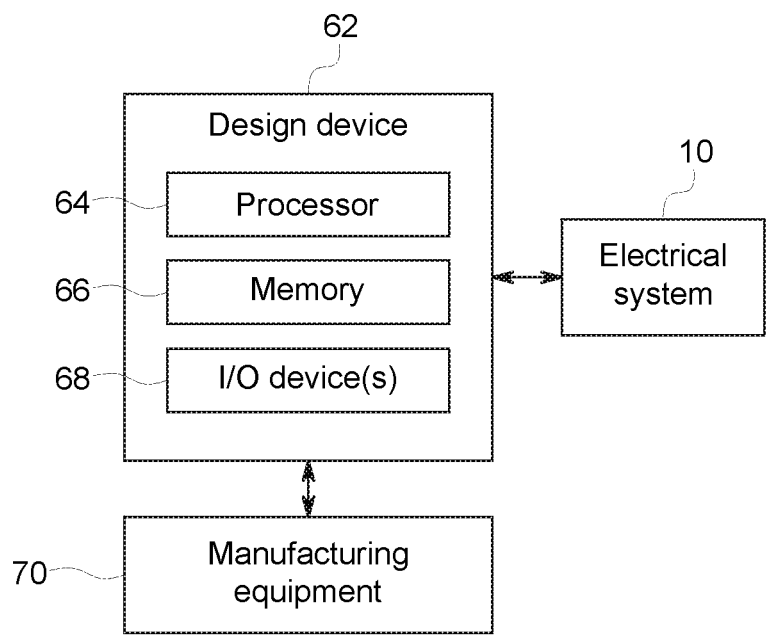
FIG. 6 is a block diagram of a design device that may facilitate implementing a bus structure, in accordance with an embodiment of the present disclosure.

Moreover, when the conductive layers 54 are approximately the same size and conductive layers 54 are implemented based on expected current flow order through the cascaded electrical devices 14, the bus structure 52 may facilitate balancing stray capacitance introduced across each of the cascaded electrical devices 14. For example, with regard to the second bus structure 52B shown in FIG. 6, voltage difference between neighboring intermediate conductive layers 54 may be approximately uniform since implemented based on expected current flow order, thereby resulting in first inter-device stray capacitance 63, second inter-device stray capacitance 65, and third inter-device stray capacitance 67 being approximately equal. Since smaller capacitance generally dominates when coupled in series, implementing a bus structure 52 in the manner described in the present disclosure may facilitate operational reliability, for example, to reduce likelihood of producing unbalanced inter-device stray capacitance that results in unbalanced voltage stress on electrical devices.

Additionally, as described above, cascaded electrical devices 14 may be implemented in an electrical system 10 to facilitate using multiple lower rated electrical devices 14 in higher electrical power applications, for example, by dividing voltage drop across the multiple lower rated electrical devices 14. Thus, implementing the bus structure 52 in the manner described herein to balance stray capacitance across each of the cascaded electrical devices 14 may facilitate improving lifespan uniformity and/or operational reliability uniformity of the cascaded electrical devices 14.

In any case, as described above, the techniques described in the present disclosure may be used to implement bus structures 52 for cascading any suitable number of electrical devices 14. However, to achieve target effects of the bus structure 52, design parameters, such as number of conductive layers 54 and/or conductive layer 54 assignments, may vary between bus structures 52, for example, based on number of electrical devices 14 intended to be electrically coupled and/or current flow capabilities intended to be provided. In some embodiments, to facilitate implementing a bus structure 52, a design device may determine target design parameters expected to enable the bus structure 52 to provide the target effects when deployed.

Figure 5:
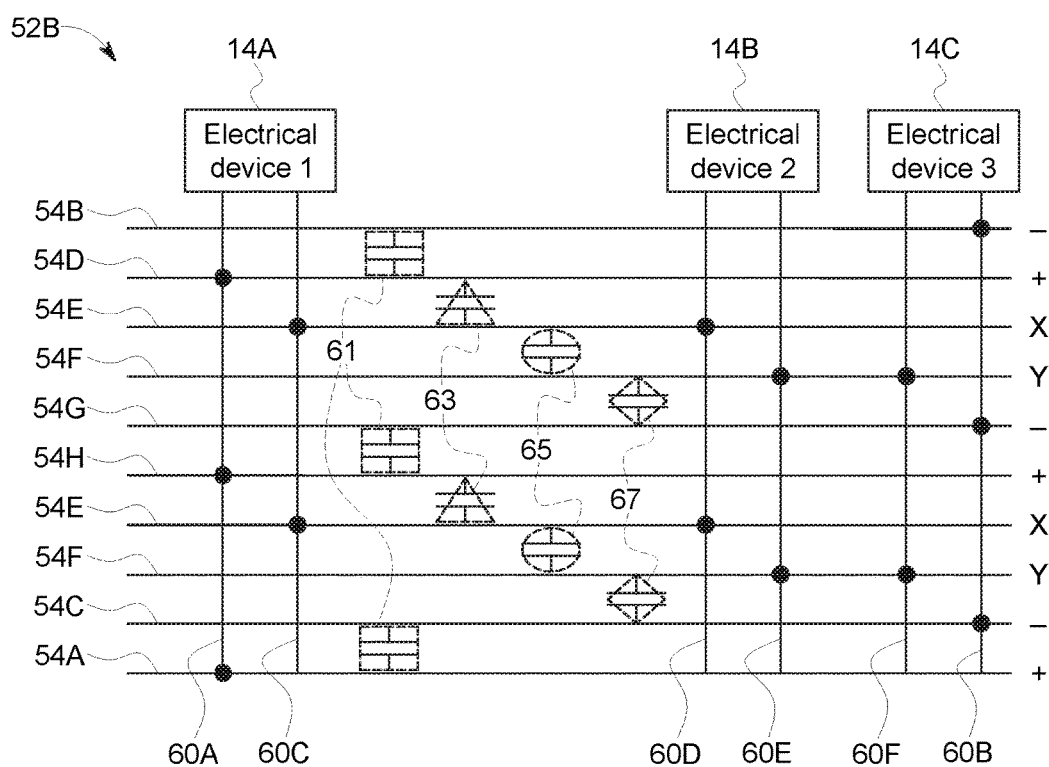
FIG. 5 is a schematic diagram of another structure implemented to electrically and physically couple cascaded electrical devices, in accordance with an embodiment of the present disclosure.

To help illustrate, one embodiment of a design device 62 is shown in FIG. 5. As depicted, the design device 62 includes a processor 64, memory 66, and one or more input/output (I/O) devices 68. Thus, the design device 62 may be any suitable electronic device, such as a handheld computing device, a tablet computing device, a notebook computer, a desktop computer, a workstation computer, a cloud-based computing device, or any combination of such devices.

In any case, the memory 66 may store instructions executable by the processor 64 and/or data to be processed (e.g., analyzed) by the processor 64, for example, to determine target design parameters of a bus structure 52. Thus, in some embodiments, the memory 66 may include one or more tangible, non-transitory, computer-readable media, such as random access memory (RAM), read only memory (ROM), rewritable non-volatile memory, flash memory, hard drives, optical discs, and/or the like. Additionally, in some embodiments, the processor 64 may include one or more general-purpose microprocessors, one or more application specific processors (ASICs), one or more field programmable logic arrays (FPGAs), or any combination thereof.

Furthermore, in some embodiments, I/O devices 68 may enable the design device 62 to interface with various other electronic devices. For example, the I/O devices 68 may communicatively couple the design device 62 to a communication network, such as a personal area network (PAN), a local area network (LAN), and/or a wide area network (WAN), thereby enabling the design device 62 to communicate with another electronic device communicatively coupled to the communication network. Additionally or alternatively, the I/O devices 68 may communicatively couple the design device 62 to a communication (e.g., serial or parallel) cable, thereby enabling the design device 62 to communicate with another electronic device communicatively coupled to the communication cable.

In any case, in some embodiments, communication between the design device 62 and other electronic devices may facilitate determining design parameters of a bus structure 52 and/or implementing (e.g., manufacturing) the bus structure 52 based at least in part on the determined design parameters. For example, to facilitate determining target design parameters of a bus structure 52, the design device 62 may be communicatively coupled to an electrical system 10, in which the bus structure 52 is expected to be deployed. In this manner, the design device 62 may analyze the electrical system 10 to determine characteristics expected to be relevant to design of the bus structure 52, such as number of electrical devices 14 expected to be cascaded by the bus structure 52, characteristics of electrical power expected to be out output by an electrical power source 12, target characteristics of electrical power an electrical load 16 expects to receive, expected switching frequency of active electrical devices 17, and/or the like.

Additionally or alternatively, the design device 62 may be communicatively coupled to manufacturing equipment 70, which may operate to implement and/or deploy the bus structure 52. In some embodiments, the manufacturing equipment 70 may include laminating equipment, patterning equipment, masking equipment, drilling equipment, etching equipment, plating equipment, coating equipment, soldering equipment, 3D printing equipment, and/or the like. Thus, to facilitate implementing and/or deploying the bus structure 52, the design device 62 may communicate target design parameters of the bus structure 52 and/or control command to the manufacturing equipment 70.

In some embodiments, the I/O devices 68, additionally or alternatively, may enable a user to interact with the design device 62, for example, to input target design parameters and/or instructions (e.g., control commands). Thus, in some embodiments, the input device 65 may include buttons, keyboards, mice, trackpads, and/or the like. Additionally or alternatively, the display 63 may include touch components that enable user inputs to the design device 62 by detecting occurrence and/or position of an object touching its screen (e.g., surface of the display 63). In addition to enabling user inputs, the display 63 may present visual representations of information, such as characteristics of the electrical system 10 and/or target design parameters, to facilitate implementation (e.g., assembly) and/or deployment of the bus structure 52.

Thus, the design device 62 may operate to determine target design parameters for bus structures 52. To help further illustrate, one embodiment of a process 72 for operating a design device 62 is described in FIG. 6. Generally, the process 72 includes determining expected characteristics of an electrical system (process block 74) and determining target design parameters of a bus structure to be deployed in the electrical system (process block 76). In some embodiments, the process 72 may be implemented by executing instructions stored in one or more tangible, non-transitory, computer-readable media, such as memory 28 or memory 66, using processing circuitry, such as processor 26 or processor 64.

Accordingly, in some embodiments, the design device 62 may determine characteristics of an electrical system 10, in which a bus structure 52 is expected to be deployed (process block 74). As described above, in some embodiments, the design device 62 may determine characteristics of the electrical system 10 based at least in part on automated analysis of the electrical system 10. Additionally or alternatively, the design device 62 may determine characteristics of the electrical system 10 based at least in part on user inputs, for example, received via the I/O devices 68.

As described above, to facilitate improving operation of the electrical system 10, the design device 62 may determine characteristics of the electrical system 10 expected to impact ability of the bus structure 52 to provide target effects, such as reduced stray inductance, increased stray capacitance, and/or balanced stray capacitance. In some embodiments, such characteristics may include number of electrical devices 14 expected to be cascaded by the bus structure 52, expected current flow order through the cascaded electrical devices 14, and/or expected operational (e.g., current and/or voltage) rating of the electrical system 10.

Based at least in part on the expected characteristics, the design device 62 may determine target design parameters of the bus structure 52 (process block 76). For example, based at least in part on the expected number of electrical devices 14, the design device 62 may determine number of conductive layers 54 and, thus, number of non-conductive layers 56 that should be implemented in the bus structure 52. In some embodiments, the design device 62 may determine that, to cascade N electrical devices 14, the bus structure 52 should include N+3 conductive layers 54. Additionally, since non-conductive layers 56 are formed between neighboring pairs of conductive layers 54, the design device 62 may determine that the bus structure 52 should include at least N+2 non-conductive layers 56. For example, when the bus structure 52 is expected to cascade four electrical devices, the design device 62 may determine that the bus structure 52 should include seven conductive layers 54 and at least six non-conductive layers 56.

Additionally, based at least in part on the expected current flow order and/or relative position (e.g., order) of the conductive layers 54, the design device 62 may assign each conductive layer 56 as one of a positive layer, a negative layer, and an inter-device layer. In some embodiments, the design device 62 may assign one outer conductive layer 56 as a positive layer and the other outer conductive layer 56 as a negative positive layer. To facilitate reducing stray inductance and/or increasing stray capacitance, the design device 62 may assign one intermediate conductive layer 54 neighboring (e.g., closest to) the positive outer conductive layer as a negative layer and another intermediate conductive layer 54 neighboring the negative outer conductive layer 56 as a positive layer. Moreover, in some (e.g., stacked) embodiments, the design device 62 may assign (M−1) pairs of central conductive layers 54 each as a positive and negative layer pair.

Additionally, the design device 62 may assign each remaining (e.g., not positive or negative) intermediate conductive layer 54 as an inter-device layer. To facilitate balancing stray capacitance, in some embodiments, the design device 62 may assign intermediate conductive layers 54 as inter-device layers such that each inter-device layer is electrically coupled to an opposite side of an electrical device 14 compared to its neighboring conductive layer 54. For example, when a conductive layer 54 is expected to be electrically coupled to an input side of an electrical device 14, the design device 62 may assign a neighboring conductive layer 54 as an inter-device layer to be electrically coupled to an output side of the electrical device 14, which facilitates providing an electrical connection 50 between the electrical device 14 and the next downstream electrical device 14. Additionally or alternatively, when the conductive layer 54 is expected to be electrically coupled to an output side of the electrical device 14, the design device 62 may assign the neighboring conductive layer 54 as an inter-device layer to be electrically coupled to an input side of the electrical device 14, which facilitates providing an electrical connection between the electrical device 14 and the previous upstream electrical device 14.

In this manner, the design device 62 may determine target design parameters to be used to implement a bus structure 52 including number of conductive layers 54 and/or assignment of each conductive layer 54. In some embodiments, the target design parameters may additionally include target size (e.g., height, width, and/or length) of each layer, target material composition of each layer, target size of each through-holes 58, target placement of each through-holes 58, target size of each perpendicular via 60, target material composition of each perpendicular via, and/or the like. In any case, the bus structure 52 may be implemented based at least in part on the target design parameters, for example, when the design device 62 communicates the target design parameters to the manufacturing equipment 70.

Figure 7:
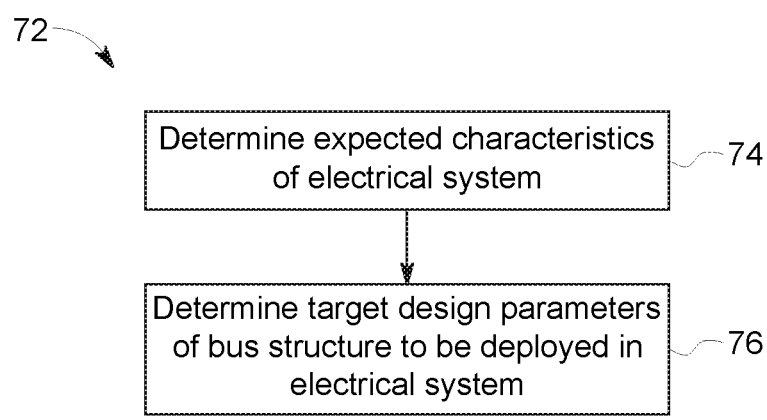
FIG. 7 is a flow diagram of a process for operating the design device, in accordance with an embodiment of the present disclosure.
Figure 8:
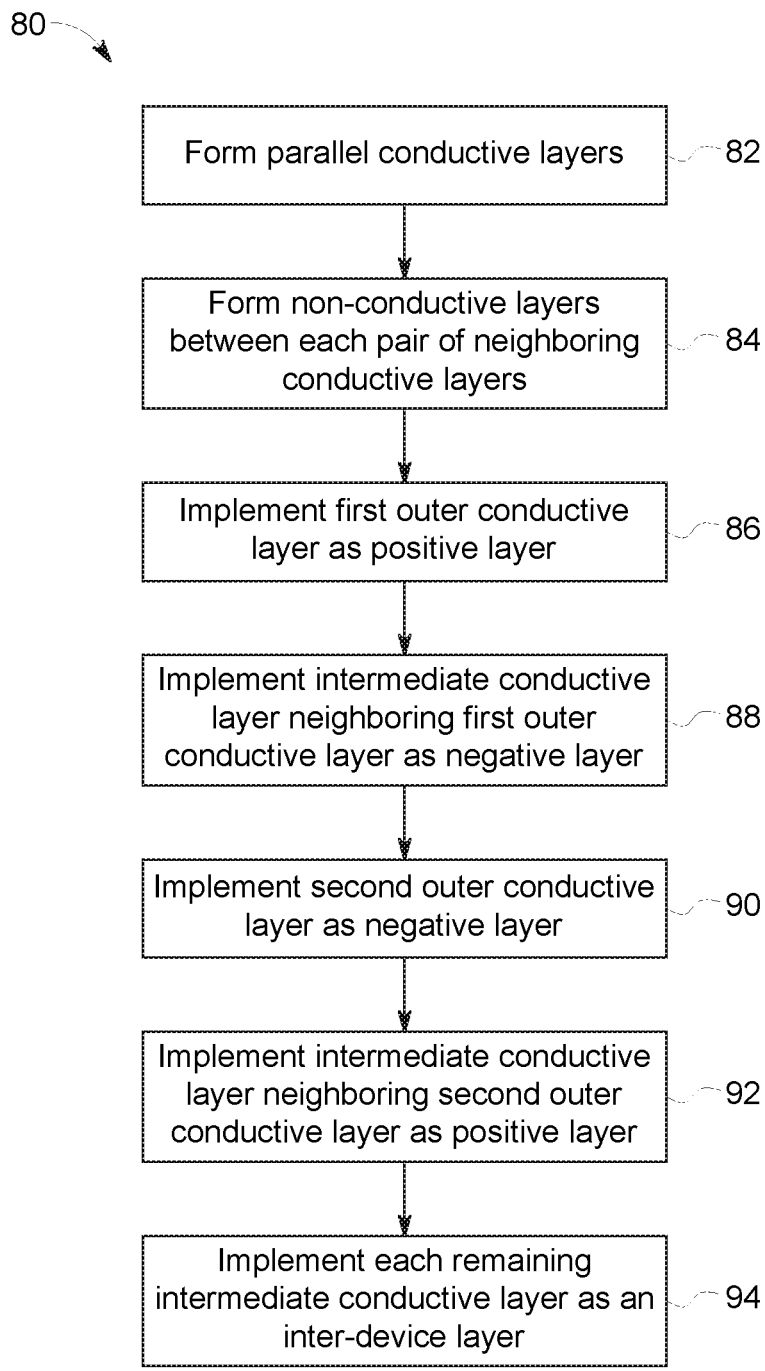
FIG. 8 is a flow diagram of a process for implementing the bus structure, in accordance with an embodiment of the present disclosure.

To help illustrate, one embodiment of a process 80 for implementing a bus structure 52 is described in FIG. 7. Generally, the process 80 includes forming parallel conductive layers (process block 82), forming non-conductive layers between each pair of neighboring conductive layers (process block 84), implementing a first outer conductive layer as a positive layer (process block 86), implementing an intermediate conductive layer neighboring the first outer conductive layer as a negative layer (process block 88), implementing a second outer conductive layer as a negative layer (process block 90), implementing an intermediate conductive layer neighboring the second outer conductive layer as a positive layer (process block 92), and implementing each remaining intermediate conductive layer as an inter-device layer (process block 94). In some embodiments, the process 80 may be implemented by executing instructions stored in one or more tangible, non-transitory, computer-readable media, such as memory 28 or memory 66, using processing circuitry, such as processor 26 or processor 64.

Accordingly, in some embodiments, the design device 62 may instruct the manufacturing equipment 70 to implement the bus structure 52, for example, by communicating control signals and/or control commands based at least in part on target design parameters. In particular the design device 62 may instruct the manufacturing equipment 70 form parallel conductive layers 54 (process block 82) with a non-conductive layers 56 between each pair of neighboring conductive layers 54 (process block 84). In some embodiments, the manufacturing equipment 70 may form the layers by alternatingly depositing conductive material and non-conductive material. In this manner, the bus structure 52 may be implemented such that neighboring conductive layers 54 are physically separated by a non-conductive layer 56.

Additionally, the design device 62 may instruct the manufacturing equipment 70 to implement a first outer conductive layer 54A as a positive layer (process block 86) and to implement a second intermediate conductive layer 54D neighboring a second outer conductive layer 54B as a positive layer (process block 92). In some embodiments, to facilitate implementation as a positive layer, the manufacturing equipment 70 may prepare the first outer conductive layer 54A and/or the second intermediate conductive layer 54D for electrical connection to the positive DC bus 46. Additionally, in some embodiments, the manufacturing equipment 70 may form a first through-hole 58 through at least the first outer conductive layer 54A and the second intermediate conductive layer 54D. In such embodiments, the manufacturing equipment 70 may then form a first perpendicular via 60A in the first through-hole 58 such that the first perpendicular via 60A is electrically coupled to the first outer conductive layer 54A and the second intermediate conductive layer 54D, but electrically insulated from the other conductive layers 54. Furthermore, in some embodiments, the manufacturing equipment 70 may form the first perpendicular via 60A such that it extends outwardly from the layers of the bus structure 52 to facilitate electrically coupling an electrical device 14 (e.g., the first electrical device 14A) to the first perpendicular via 60A.

The design device 62 may also instruct the manufacturing equipment 70 to implement a first intermediate conductive layer 54C neighboring the first outer conducive layer 54A as a negative layer (process block 88) and to implement the second outer conductive layer 54B as a negative layer (process block 90). In some embodiments, to facilitate implementation as a negative layer, the manufacturing equipment 70 may prepare the second outer conductive layer 54B and/or the first intermediate conductive layer 54C for electrical connection to the negative DC bus 48. Additionally, in some embodiments, the manufacturing equipment 70 may form a second through-hole 58 through at least the second outer conductive layer 54B and the first intermediate conductive layer 54C. In such embodiments, the manufacturing equipment 70 may then form a second perpendicular via 60B in the second through-hole 58 such that the second perpendicular via 60B is electrically coupled to the second outer conductive layer 54B and the first intermediate conductive layer 54C, but electrically insulated from the other conductive layers 54. Furthermore, in some embodiments, the manufacturing equipment 70 may form the second perpendicular via 60B such that it extends outwardly from the layers of the bus structure 52 to facilitate electrically coupling another electrical device 14 (e.g., third electrical device 14C) to the second perpendicular via 60B.

The design device 62 may also instruct the manufacturing equipment 70 to implement each remaining intermediate conductive layers 54 (e.g., third intermediate conductive layer 54E and fourth intermediate conductive layer 54F) as an inter-device layer (process block 94). As described above, in some embodiments, the remaining intermediate conductive layers 54 may be implemented as inter-device layers based at least in part on expected current flow order through the cascaded electrical devices 14 and/or relative position of the remaining intermediate conductive layers 54. When stacked to increase current flow capabilities, neighboring intermediate conductive layers 54 may nevertheless be implemented as a positive and negative layer pair.

Additionally, in some embodiments, the manufacturing equipment 70 may form a through-hole 58 corresponding to each inter-device layer. In particular, the through-hole 58 may be formed at least through the intermediate conductive layer 54 implemented as the corresponding inter-device layer. In such embodiments, the manufacturing equipment 70 may then form a perpendicular via 60 in each through-hole 58 such that the perpendicular via 60 is electrically coupled to the corresponding intermediate conductive layer, but electrically insulated from the other conductive layers 54. Furthermore, in some embodiments, the manufacturing equipment 70 may form the perpendicular vias 60 (e.g., third perpendicular vias 60C, fourth perpendicular vias 60D, fifth perpendicular vias 60E, and/or sixth perpendicular vias 60F) such that they extends outwardly from the layers of the bus structure 52 to facilitate electrically coupling an electrical device 14 (e.g., first electrical device 14A, second electrical device 14, or third electrical device 14C) to each.

In this manner, a bus structure 52 used to cascade multiple electrical devices 14 may be implemented. Moreover, as described above, deploying a bus structure 52 implemented using the techniques described herein in an electrical system 10 may facilitate improving operation of the electrical system 10. To deploy the bus structure 52, electrical devices 14 may be electrically and physically coupled to perpendicular vias 60 formed in the bus structure 52. Additionally, one or more conductive layers 54 implemented as a positive layer may be electrically coupled to the positive DC bus 46 and one or more conductive layers implemented as a negative layer may be electrically coupled to the negative DC bus 48.

Accordingly, the technical effects of the techniques described in the present disclosure include enabling deployment of cascaded electrical devices in an electrical system in a manner that improves operation of the electrical system. In particular, the present disclosure describes techniques for implementing a bus structure (e.g., bus bar or PCB) that may be used cascade multiple electrical devices in a manner that facilitate reducing stray capacitance introduced in the electrical system, increasing stray capacitance introduced in the electrical system, and/or balancing stray capacitance between the cascaded electrical devices. By reducing stray inductance and/or increasing stray capacitance, the bus structure may facilitate reducing voltage stress (e.g., overshoot or spike) that may otherwise be produced during operation of the electrical system, thereby improving lifespan and/or operational reliability of one or more electrical devices in the electrical system. Moreover, by balancing stray capacitance between the cascaded electrical devices, the bus structure may facilitate balancing wear between the cascaded electrical devices, thereby improving lifespan uniformity and/or operational reliability uniformity of the cascaded electrical devices.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. An electrical system comprising a first bus structure configured to cascade a first plurality of electrical devices, wherein the first bus structure comprises:
a first outer conductive layer implemented as a first positive layer;
a second outer conductive layer implemented as a first negative layer;
a first intermediate conductive layer neighboring the first outer conductive layer and electrically coupled to the second outer conductive layer, wherein the first intermediate conductive layer is implemented as a second negative layer to facilitate reducing stray inductance, increasing stray capacitance, or both introduced in the electrical system during operation;
a second intermediate conductive layer neighboring the second outer conductive layer and electrically coupled to the first outer conductive layer, wherein the second intermediate conductive layer is implemented as a second positive layer to facilitate reducing the stray inductance, increasing the stray capacitance, or both introduced in the electrical system during operation; and
a third intermediate conductive layer neighboring the second intermediate conductive layer, wherein the third intermediate conductive layer is implemented as a first inter-device layer that facilitates electrically coupling at least two of the first plurality of electrical devices in series.

2. The electrical system of claim 1, comprising:
an alternating current power source configured to output alternating current electrical power;
a direct current load configured to operate using direct current electrical power;
a power converter electrically coupled between the alternating current power source and the direct current load, wherein the power converter comprises a switching device configured to disable current flow in an open position and enable current flow in a closed position; and
a control system communicatively coupled to the power converter, wherein the control system is configured to instruct the switching device to alternatingly switch between the open position and the closed position to facilitate converting alternating current electrical power received from the alternating current power source into direct current electrical power, wherein:
switching the switching device from the open position to the closed position produces a voltage overshoot that propagates to the first plurality of electrical devices; and
magnitude of the voltage overshoot varies based at least in part on the stray inductance and the stray capacitance introduced in the electrical system.

3. The electrical system of claim 1, comprising:
a positive direct current bus electrically coupled to the first outer conductive layer and the second intermediate conductive layer; and
a negative direct current bus electrically coupled to the second outer conductive layer and the first intermediate conductive layer;
wherein the first bus structure is configured to electrically couple each of the first plurality of electrical devices in series between the positive direct current bus and the negative direct current bus when deployed in the electrical system.

4. The electrical system of claim 1, comprising a fourth intermediate conductive layer neighboring the third intermediate conductive layer and neighboring the first intermediate conductive layer, wherein:
the first plurality of electrical devices comprises a first electrical device, a second electrical device, and a third electrical device;
the first outer conductive layer is implemented as the first positive layer and the second intermediate conductive layer is implemented as the second positive layer to facilitate electrically coupling the first electrical device to a positive direct current bus;
the second outer conductive layer is implemented as the first negative layer and the first intermediate conductive layer is implemented as the second negative layer to facilitate electrically coupling the third electrical device to a negative direct current bus;
the third intermediate conductive layer is implemented as the first inter-device layer to facilitate electrically coupling the first electrical device and the second electrical device in series between the positive direct current bus and the negative direct current bus; and
the fourth intermediate conductive layer is implemented as a second inter-device layer to facilitate electrically coupling the second electrical device and the third electrical device in series between the positive direct current bus and the negative direct current bus.

5. The electrical system of claim 4, wherein:
the first electrical device comprises a first capacitor, the second electrical device comprises a second capacitor, and the third electrical device comprises a third capacitor; or
the first electrical device comprises a first semiconductor switching device, the second electrical device comprises a second semiconductor switching device, and the third electrical device comprises a third semiconductor switching device.

6. The electrical system of claim 1, wherein the first bus structure comprises:
a first through-hole formed through at least the first outer conductive layer and the second intermediate conductive layer;
a first perpendicular via disposed in the first through-hole, wherein:
the first perpendicular via is electrically coupled to the first outer conductive layer and the second intermediate conductive layer in the first through-hole;
the first perpendicular via is electrically insulated from the second outer conductive layer, the first intermediate conductive layer, and the third intermediate conductive layer in the first through-hole; and
the first perpendicular via extends outwardly from the first bus structure to facilitate electrically and physically coupling a first electrical device of the first plurality of electrical devices to the first perpendicular via;
a second through-hole formed through at least the second outer conductive layer and the first intermediate conductive layer;
a second perpendicular via disposed in the second through-hole, wherein the second perpendicular via is:
electrically coupled to the second outer conductive layer and the first intermediate conductive layer in the second through-hole;
electrically insulated from the first outer conductive layer, the second intermediate conductive layer, and the third intermediate conductive layer in the second through-hole; and
extends outwardly from the first bus structure to facilitate electrically and physically coupling a second electrical device of the first plurality of electrical devices to the second perpendicular via;
a third through-hole formed through at least the third intermediate conductive layer; and
a third perpendicular via disposed in the third through-hole, wherein the third perpendicular via is:
electrically coupled to the third intermediate conductive layer in the third through-hole;
electrically insulated from the first outer conductive layer, the second outer conductive layer, the first intermediate conductive layer, and the second intermediate conductive layer in the third through-hole; and
extends outwardly from the first bus structure to facilitate electrically and physically coupling the first electrical device to the third perpendicular via.

7. The electrical system of claim 1, wherein:
the first plurality of electrical devices comprises a first electrical device, a second electrical device, and a third electrical device;

the third intermediate conductive layer is implemented as the first inter-device layer to facilitate electrically coupling the first electrical device and the second electrical device in series; and
the first bus structure comprises:
a fourth intermediate conductive layer neighboring the third intermediate conductive layer, wherein the fourth intermediate conductive layer is implemented a second inter-device layer to facilitate electrically coupling the second electrical device and the third electrical device in series;
a fifth intermediate conductive layer neighboring the fourth intermediate conductive layer, wherein the fifth intermediate conductive layer is implemented as a third negative layer;
a sixth intermediate conductive layer neighboring the fifth intermediate conductive layer, wherein the sixth intermediate conductive layer is implemented as a third positive layer;
a seventh intermediate conductive layer neighboring the sixth intermediate conductive layer, wherein the seventh intermediate conductive layer is implemented as a third inter-device layer to facilitate electrically coupling the first electrical device and the second electrical device in series; and
an eighth intermediate conductive layer neighboring the first intermediate conductive layer and the seventh intermediate conductive layer, wherein the eighth intermediate conductive layer is implemented as a fourth inter-device layer to facilitate electrically coupling the second electrical device and the third electrical device in series.

8. The electrical system of claim 1, comprising a second bus structure configured to cascade a second plurality of electrical devices, wherein the second bus structure comprises:
a third outer conductive layer implemented as a third positive layer;
a fourth outer conductive layer implemented as a third negative layer;
a fourth intermediate conductive layer neighboring the third outer conductive layer and electrically coupled to the fourth outer conductive layer, wherein the fourth intermediate conductive layer is implemented as a fourth negative layer to facilitate reducing the stray inductance, increasing, the stray capacitance, or both introduced in the electrical system during operation;
a fifth intermediate conductive layer neighboring the fourth outer conductive layer and electrically coupled to the third outer conductive layer, wherein the fifth intermediate conductive layer is implemented as a fourth positive layer to facilitate reducing the stray inductance, increasing the stray capacitance, or both introduced in the electrical system during operation; and
a sixth intermediate conductive layer neighboring the fifth intermediate conductive layer, wherein the sixth intermediate conductive layer is implemented as a second inter-device layer to facilitate electrically coupling at least two of the second plurality of electrical devices in series.

9. The electrical system of claim 1, wherein the first bus structure comprises a bus bar or a printed circuit board.

10. The electrical system of claim 1, wherein the electrical system comprises an industrial system, a manufacturing system, an automation system, a factory, a plant, a computing system, a computer, an automotive system, an airplane, a boat, or a car.

* * * * *